United States Patent [19]
Brower

[11] Patent Number: 4,459,102
[45] Date of Patent: Jul. 10, 1984

[54] CROSSOVER SWITCH

[75] Inventor: Boyd G. Brower, Williamsport, Pa.

[73] Assignee: GTE Products Corporation, Stamford, Conn.

[21] Appl. No.: 365,680

[22] Filed: Apr. 5, 1982

[51] Int. Cl.³ .............................................. F21K 5/02
[52] U.S. Cl. .................................................. 431/359
[58] Field of Search ............. 431/359; 362/3, 5, 13–15

[56] References Cited

U.S. PATENT DOCUMENTS 4,017,728 4/1977 Audesse et al. ........................ 362/13
4,286,307 8/1981 Harvey et al. ......................... 362/13
4,330,821 5/1982 Brower et al. ......................... 362/13

Primary Examiner—Carroll B. Dority, Jr.
Attorney, Agent, or Firm—Thomas H. Buffton

[57] ABSTRACT

A multilamp photoflash array has a circuit board with a printed circuit thereon and a plurality of flashlamps connected to the printed circuit with a normally open (N/O) switch of electrically insulating material overlaying a portion of the printed circuit and a normally closed (N/C) switch of solid electrically conductive material overlaying the normally open (N/O) switch and portion of the printed circuit to provide a crossover switch. A process for fabricating a crossover switch includes affixing the printed circuit to the circuit board, depositing a normally open (N/O) switch over a portion thereof and attaching a normally closed (N/C) switch of solid electrically conductive material over the printed circuit portion and normally open (N/O) switch to provide a crossover switch.

16 Claims, 2 Drawing Figures

CROSSOVER SWITCH

TECHNICAL FIELD

This invention relates to multilamp photoflash arrays and more particularly to multilamp photoflash arrays wherein a normally closed (N/C) switch utilizes a normally open (N/O) switch as an insulator to permit crossover of a printed circuit.

BACKGROUND ART

Generally, multilamp photoflash arrays are constructed to provide sequential operation of a multiplicity of flashlamps. One example of such structures is the so-called "flipflash" as described in U.S. Pat. Nos. 3,894,226 and 4,017,728.

The flipflash unit comprises an elongated planar array of eight high voltage type flashlamps mounted on a printed circuit board with an array of respectively associated reflectors disposed therebetween. The lamps are aranged in two groups of four disposed on the upper and lower halves respectively of the rectangular-shaped circuit board. A set of terminal contacts at the lower end of the unit is provided for activation of the upper group of lamps, while a set of terminal contacts at the top of the unit is operatively associated with the lower group of lamps. The application of successive high voltage pulses (e.g. 2000 to 4000 volts from, say, a piezoelectric source controlled by the shutter of a camera in which the array is inserted) to the terminal contact at the lower end of the unit causes the four lamps at the upper half of the array to be sequentially ignited. The array may then be turned end for end and again inserted into the camera in order to flash the remaining four lamps. In this manner one group of lamps (or half of the array) functions as a flash extender for the other group of lamps so that only the group of lamps relatively farther from the camera lens axis may be flashed. The purpose of such an arrangement is to position the "active" group of flashlamps farther above the camera lens in order to reduce the possibility of a "red-eye" effect that causes the pupils of a person's eyes to appear red or pink in flash pictures taken when the flashlamp is close to a camera lens.

The flipflash circuit board comprises an insulating sheet of plastic having a pattern of conductive circuit runs, including the terminal contacts, on one surface. The flashlamp lead-in wires are electrically connected to the circuit runs by means of eyelets secured to the circuit board and crimped to the lead-in wires. The circuitry on the board includes six printed, normally open, connect switches that chemically change from high to low resistance so as to become electrically conducting after exposure to the radiant energy from an ignited flashlamp operatively associated therewith. The purpose of these switches is to provide lamp sequencing and one-at-a-time flashing. The four lamps of each group are arranged in a parallel circuit, with three of the four lamps being connected in series with respective thermal connect switches. The circuitry on the board further includes a common circuit conductor run which is connected to one lead-in wire of each of the flashlamps in both groups and extends continuously from one end of the circuit board to the other between the common terminal contact at each end of the unit. Initially, only the first of the group of four lamps is connected directly to the high voltage pulse source. When this first lamp flashes, it causes its associated thermal connect switch (which is series connected with the next or second lamp) to become permanently conductive. Because of this action, the second lamp of the group of four is connected to the pulse source. This sequence of events is repeated until all four lamps have been flashed.

The overall construction of the flipflash unit comprises front and back plastic housing members with interlocking means for providing a unitary structure. The front housing member is a rectangular concavity, and the back housing is substantially flat. Sandwiched between the front and back housing members, in the order named, are the flashlamps, a unitary member, preferably of aluminum-coated plastic, shaped to provide the eight individual reflectors of the array, an insulating sheet, a printed circuit board, and an indicia sheet, which is provided with information trademarks and flash indicators located behind the representative lamps and which change color due to heat and/or light radiation from a flashing lamp, thus indicating at a glance which of the lamps have been flashed and not flashed. Each of the individual reflectors has a concave (generally parabolic) surface with the lamps being disposed within this concavity; the rear surface of the reflector has holes or slots to permit light and heat radiation to pass through for actuating circuit board switches and flash indicators. In order to provide electrostatic shielding for the lamps and circuitry, the reflector member is rendered electrically conductive by a reflective metalized coating thereon, and this coating is electrically connected to the common circuit conductor run on the printed circuit board. Further, a metal foil is laminated on the indicia sheet and also connected to this common conductor run of the circuit board.

U.S. Pat. No. 4,164,007 describes an improved multi-lamp photoflash unit which more efficiently utilizes a given housing volume and thereby reduces the cost of the unit per flashlamp contained therein. More specifically, a compact lamp arrangement is provided whereby additional lamps are contained in a given volume while maintaining light output performance requirements. In a particular embodiment described, ten lamps are provided in a housing having the same dimensions as the above-discussed eight-lamp flipflash unit. This greater compactness is provided by arranging the planar array of lamps in two parallel columns with the tubular envelopes horizontally disposed and with the lamps of one column staggered with respect to the other so that the bases are interdigitated. A pair of reflector panels are aligned with the two columns of lamps and are arranged to overlie the lamp lead-in wires and bases.

Also, U.S. Pat. No. 4,302,794, assigned to the present assignee, describes a more compact, cost-efficient photoflash unit construction comprising a linear array of electrically ignitable flashlamps mounted on a printed circuit board in the form of an elongated strip. The printed circuit strip is located within the longitudinal channel of an elongated housing member having reflective surfaces adjacent to the lamps. A light-transmitting cover panel is attached to the front of the housing member to enclose the flashlamps. The lamps have substantially tubular envelopes and are positioned extremely close to one another with their longitudinal axes substantially parallel to the surface of the printed circuit strip and in substantially coaxial alignment. Typically, the diameter of the lamps, the width of the printed circuit strip, and the width of the channel in the housing member are nearly equal. In order to provide protection against the red-eye effect, a double-ended linear array is described which operates in similar fashion to the aforementioned flipflash. In one specific embodiment, three lamps mounted in the upper half of the printed circuit strip are controlled by a pair of contact terminals at the lower end of the unit, while three lamps in the lower half of the unit are controlled by contact terminals at the top end of the unit. One of the contact terminals for controlling a group of lamps is connected in common to a lead-in wire of each of the lamps of the group, while the other contact is a "hot," or signal, terminal coupled through switching circuitry to the other lead-in wire of each of the lamps. Accordingly, in order to provide an interconnection between the signal terminals at each end of the unit and the respective switching circuitry controlled thereby on opposite halves of the printed circuit strip, respective signal conductor runs must be extended through the respectively inactive halves of the printed circuit strip, respective signal conductor runs must be extended through the respectively inactive halves of the circuit strip. The interconnecting conductor runs from the common terminal contacts are disposed along the outer sides of the circuit-containing surface of the printed circuit board. More specifically, the common circuit run on the bottom half of the circuit board strip is located on the opposite side of the circuit board surface from the common circuit run on the top half of the printed circuit board. As a result, a crossover, or side-to-side connection of the common circuit run is required in order to connect the common terminal at one end of the printed circuit strip with the common circuit conductor run connected to lamp leads in the opposite half of the circuit strip. Such a problem is created by the severe crowding of the conductive paths of this extremely compact unit. The use of printed conductor runs on both sides of the circuit strip with conventional through-connections introduces undesirable cost, e.g., two circuit screening operations are needed together with eyelets, plated-through holes, or the like. A minimum inter-run spacing of about 1.5 millimeters is necessary in order to prevent failure, i.e., promoting electrical sparkover from one run to another at the high voltages used (e.g. 2,000 volts or more).

Also, U.S. Pat. No. 4,286,307, assigned to the assignee of the present invention, sets forth a multilamp photoflash array wherein the ciruit board is in the form of an elongated strip, and the flashlamps are divided into first and second groups of two or more lamps each disposed on respectively opposite halves of the printed circuit strip over the surface containing circuitry. The circuit board and lamps are disposed within the longitudinal channel of an elongated housing member having reflective surfaces adjacent to the flashlamps. The first and second conductor runs comprise a common circuit with the first run connected electrically to one lead-in wire of each of the first group of lamps and the second common circuit run being connected electrically to one lead-in wire of each of the second group of lamps. The printed circuit strip includes first and second connector terminal means at respectively opposite ends, with the first connector-terminal being located on the half of the circuit strip containing the first group of lamps and separated thereby from the second group of lamps, and the second connector-terminal being located on the half of the circuit strip containing the second group of lamps and separated thereby from the first group of lamps. The first common circuit run extends to the first connector-terminal means. A portion of the circuitry couples the first connector-terminal means to each lamp of the second group of lamps and another portion of the circuitry couples the second connector-terminal means to each lamp of the first group of lamps. The first and second groups of lamps are disposed in a linear array, and the channel in the housing member has a cross-section which is substantially semi-rectangular. A continuous coating of conductive reflective material may cover the rear wall and opposite sidewalls of the semi-rectangular channel, and the first and second common circuit runs are respectively disposed parallel and closer to opposite edges of the printed circuit strip facing opposite sidewalls of the channel. The common circuit coupling portion of the circuitry includes the staple which is secured to the circuit board with its center region disposed between the side of the circuit board opposite that carrying the conductor runs and the rear wall of the semi-rectangular channel. In this manner, the center region of the staple can be placed in contact with the conductively coated rear wall of the channel whereby the first and second circuit runs are electrically connected to the conductive reflective coating on the channel walls.

The first and second common circuit conductor runs have respective spaced apart terminations about the midportion of the circuit strip, and the legs of the staple are bent over the conductor-carrying surface of the circuit strip and in contact with respective ones of the terminations of the first and second runs. The circuitry further includes a third conductor run which is connected electrically to the noncommon-connected lead-in wire of one of the lamps and located between the spaced-apart terminations of the first and second runs.

Preferably the housing member is formed of an insulating material and further includes a plurality of segments of reflector cavities formed on opposite sides of the channel, and the unit further includes a light-transmitting cover panel attached to the housing member and enclosing the flashlamps therein. The required crossover connection in this compact array is effectively and inexpensively achieved by use of the conductive, non-corrosive staple as an active, current-carrying segment of the circuitry for carrying lamp-fiashing current pulses from the camera socket interface to the lamps in the far end of the array. Wire staples are inexpensive and readily available and provide a simple, rapid manner of implementing circuit run jumpers on ciruit boards. No soldering or other operations are required once the staple is installed on the board.

Additionally, it is known that multilamp photoflash arrays having a connector at opposite ends are available, and one example of such an array is set forth in U.S. Pat. No. 4,051,359. Therein, the array is arranged in a manner to provide upper and lower lamp groups with connectors arranged to energize the lamp group farthest away. Thus, the undesired and known "red-eye" condition is eliminated or at least greatly reduced. Also, the above-mentioned patent sets forth and provides a capability for energization of the closer group of lamps after sequential operation of the furthest lamp group should an operator forget to reverse the array and couple the opposite connector to the energizing source.

Other known techinques for fabricating multilamp photoflash arrays include a process wherein circuit runs are either screen-printed or die-stamped onto a printed circuit board. A screen crossover insulator material is then deposited onto a portion of the circuit runs on the circuit board. Then, a screen-crossover circuit run is printed over the insulator material. Finally, normally open (N/O) switches are screened over the crossover circuit run.

Although the above-described fabrication process has been utilized to provide photoflash arrays, it has been found that problems and non-uniform results tend to arise with such situations and techniques. More specifically, it has been found that a screened-type of crossover insulator configuration requires special materials and special process steps. Unfortunately, solvents and other liquids of the final screening material tend to penetrate the screened insulating material or switch paste whereon the final screening material is deposited. As a result, incomplete conversion of the switches and insulation failures occur which are deleterious to circuit integrity and consistency.

It may be noted that screenable insulators have been fabricated which work very well. However, such structures tend to require not only the above-mentioned special materials which are impervious to the solvents in the materials screened thereon, but also require special and added firing and processing steps. Moreover, it is obvious that such special materials and added processing steps tend to undesirably increase the cost of fabricating the structure.

DISCLOSURE OF THE INVENTION

An object of the present invention is to provide an improved multilamp photoflash array. Another object of the invention is to enhance the circuit crossover capabilities of a multilamp photoflash array. Still another object of the invention is to improve the fabrication of a multilamp photoflash array having a crossover switch. A further object of the invention is to provide an improved photoflash array fabricated by an enhanced process with a resultant reduction in cost.

These and other objects, advantages and capabilities are achieved in one aspect of the invention by a multilamp photoflash array having a circuit board with a printed circuit thereon with at least one normally open (N/O) switch overlaying a portion of the printed circuit and a normally closed (N/C) switch overlaying the normally open (N/O) switch ovelaying a portion of the printed circuit whereby a crossover switch capability is provided.

In another aspect of the invention, a process is provided for fabricating a multilamp photoflash array comprising the steps of affixing a printed circuit to a circuit board, depositing a normally open (N/O) switch in overlaying position on a portion of the printed circuit and attaching a plurality of normally closed (N/C) switches forming a portion of the circuit runs and overlaying a portion of a normally open (N/O) switch overlaying a portion of the printed circuit whereby the normally open (N/O) switch insulates the normally closed (N/C) switch from the printed circuit.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
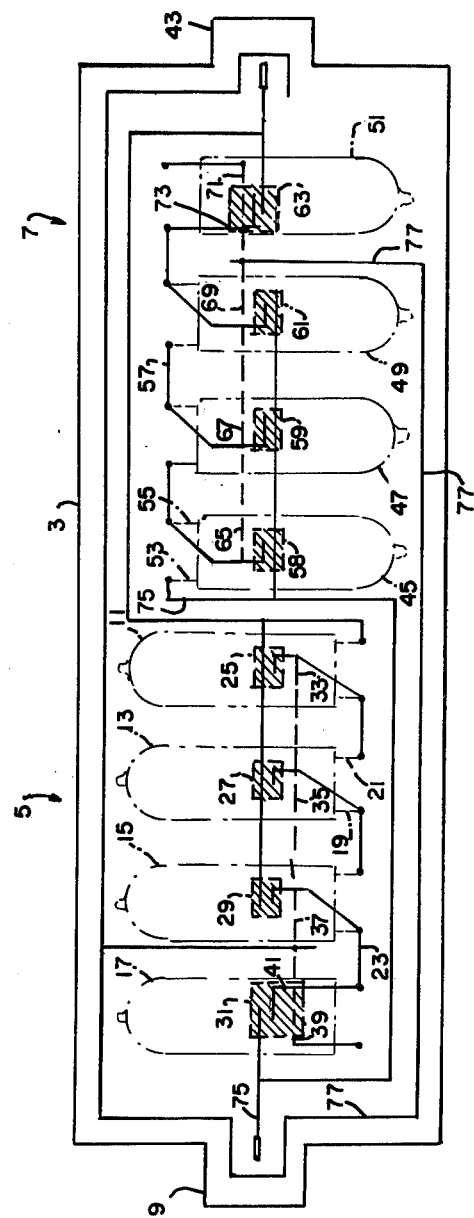
FIG. 1 is a diagrammatic illustration of a preferred form of a multilamp photoflash array having a crossover switch.

In the drawings, FIG. 1 illustrates a preferred form of multilamp photoflash array. The array includes a circuit board 3 having first and second sections 5 and 7 respectively. The first section 5 has a connector terminal 9 formed for insertion into a camera or energizing source (not shown). A plurality of flashlamps 11, 13, 15 and 17, each having a pair of electrically conductive leads 19 and 21, are attached to the circuit board 3. A printed circuit of electrically conductive runs 23 is affixed to the circuit board 3 and connected to the electrically conductive leads 19 and 21 of the flashlamps 11, 13, 15 and 17. Immediately adjacent each one of the flashlamps 11, 13, 15 and 17 is a normally open (N/O) switch 25, 27, 29 and 31 and a normally closec (N/C) switch 33, 35, 37 and 39. Moreover, one of the normally open (N/O) switches 31 and one of the normally closed (N/C) switches 39 crosses over a portion 41 of the printed circuit electrically conductive runs 23.

Similarly, the second section 7 has a connector terminal 43 formed for connection to an energizing source (not shown). A plurality of sequentially energizable flashlamps 45, 47, 49 and 51 each have a pair of electrically conductive leads 53 and 55 which are attached to the circuit board 3. Electrically conductive runs of a printed circuit 57 are connected to the electrically conductive leads 53 and 55. Also, normally open (N/O) switches 58, 59, 61 and 63 and normally closed (N/C) switches 65, 67, 69 and 71 are positioned immediately adjacent each one of the flashlamps 46, 47, 49 and 51 respectively. A normally open (N/O) switch 63 and a normally (N/C) switch 71 cross over a portion 73 of the printed circuit 57.

Figure 2:
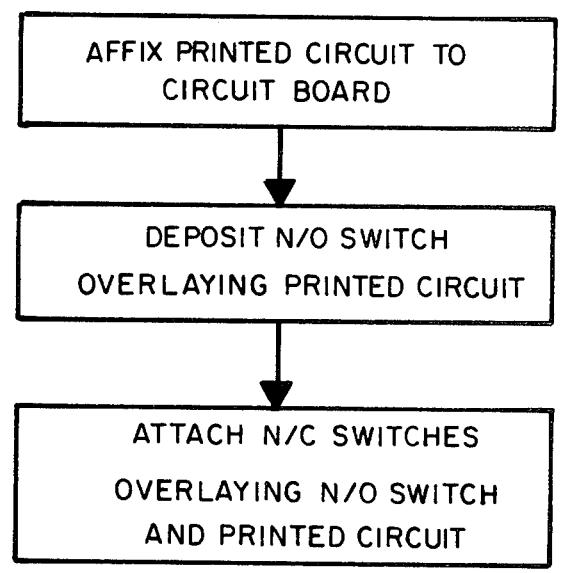
FIG. 2 is a flow diagram illustrating a preferred process for fabricating the array of FIG. 1.

As to fabrication of the above-described multilamp photoflash array, the flow chart of FIG. 2 serves to illustrate the preferred procedure. Therein, the printed circuit of electrically conductive runs 23 of the first section 5 and 57 of the second section 7, as well as the circuit run crossover portion 41 and 73 respectively, are affixed to the circuit board 3. Preferably, a die-stamped type electrically conductive circuit is employed, although electrically conductive circuits formed by a silk screening process are also applicable to the process.

Thereafter, the normally open (N/O) switches 25–31 and 58–63 are silk screened onto the circuit board 3 and overlay the crossover portions 41 and 73 of the first and second sections 5 and 7 of the printed circuit runs 23 and 57 respectively. These normally open (N/O) switches 25–31 and 58–63 are of the radiation responsive type having an open circuit resistance which is relatively high prior to activation and relatively low resistance thereafter. For example, one well known type of normally open (N/O) switch comprises silver carbonate, a polystyrene resin binder, a large proportion of electrically non-conductive particulate solids such as titanium dioxide and a protective oxidizing agent such as barium chromate.

Following, the normally closed (N/C) switches 33–39 and 65–71 which are also radiation responsive and in the form of an electrically conductive strip are attached to the printed circuit runs 23 and 57. These normally closed (N/C) switches 33-39 and 65-71 are positioned in overlapping relationship to the normally open (N/O) switches 25-31 and 58-63 and in overlapping relationship to the crossover portions 41 and 73 of the printed circuit runs 23 and 57 of the first and second sections 5 and 7 respectively.

Preferably, the electrically conductive strip forming the normally closed (N/C) switches 33-39 and 65-71 is in the form of a solid electrical conductive material such as a 60/40 solder having a thickness of about 0.001 inch, for example. This solid electrical conductive material is radiation responsive to activation of the flashlamps immediately adjacent thereto whereby a desired open circuit condition is achieved. Also, the solid electrical conductive material is especially well suited for overlaying the normally open (N/O) switches 25-31 and 58-63 which serve as an insulation intermediate the normally closed (N/C) switches 39 and 71 and the crossover portions 41 and 71 of the printed circuits 23 and 57. It is this solid electrical conductive material of the normally closed (N/C) switches 33-39 and 65-71 having an absence of penetrating solvents and other liquids which permit enhanced crossover switch fabrication.

As to operation of the above-described multilamp photoflash array, reference is made to the illustration of FIG. 1. Therein, the connector therminal 9 of the first section 5 is energized. A positive conductor 75 thereon serves to transfer a positive potential to one of the electrically conductive leads 53 of a flashlamp 45 of the second section 7. At the same time, a common or ground conductor 77 is connected by way of the continuous strip of normally closed (N/C) switches 69, 67 and 65 to the other electrically conductive lead 55 of the flashlamp 45.

Upon energization of the flashlamp 45, the normally open (N/O) switch 58 is short-circuited and energy available at the positive conductor 75 is applied to the following flashlamp 47 by way of the activated normally open (N/O) switch 58. At the same time, the normally closed (N/C) switch 65 is activated removing the common or ground connector 77 from the flashlamp 45 and providing connection to the following flashlamp 47.

Should an operator fail to reverse the circuit board 3 upon completion of the sequential activation of the flashlamps 45, 47, 49 and 51 of the second section 7 for example, the flashlamps 11, 13, 15 and 17 of the first section 5 would still be activated. In other words, a potential from the positive conductor 75 would be transmitted via the normally open (now activated) switches 61 and 63 to the flashlamp 11. At the same time, the common or ground connection 77 is coupled to the flashlamp 11 by way of the normally closed (N/C) switches 37, 35 and 33 respectively. Obviously, the reverse conditions are effected should an energizing potential be applied to the connector terminal 43 rather than the connector terminal 9.

Thus, there has been provided a unique multilamp photoflash array having an enhanced crossover switch capability. The application of a switch paste type normally open (N/O) switch positioned to overlap a portion of the printed circuit and provide an electrical insulator layer thereon in conjunction with a normally closed (N/C) switch of solid electrically conductive material absent of penetrating liquids provides a unique crossover switch array.

Also, an enhanced process is provided wherein a reduction in the number of process steps is effected. Herein, a portion of the printed circuit need no longer be covered in a separate insulator deposition step. Rather, the portion of printed circuit is insulated by a normally open (N/O) switch material and an electrically conductive path of solid electrical conductive material positioned thereon to provide a desired crossover switch.

While there has been shown and described what is at present considered the preferred embodiments of the invention, it will be obvious to those skilled in the art that various changes and modifications may be made therein without departing from the invention as defined by the appended claims.

I claim:

1. In a multilamp photoflash array having a printed circuit located on a circuit board with a plurality of flashlamps connected to said printed circuit and a normally open (N/O) and a normally closed (N/C) switch immediately adjacent each one of said flashlamps, the improvement wherein at least one of said normally open (N/O) switches overlays a portion of said printed circuit and a normally closed (N/C) switch overlays a portion of said normally open (N/O) switch and crosses over said portion of said printed circuit overlayed by said normally open (N/O) switches.

2. The improvement of claim 1 wherein said normally open (N/O) switches are electrical insulators and said normally closed (N/C) switches are electrical conductors prior to activation by an adjacent flashlamp.

3. The improvement of claim 1 wherein said normally open (N/O) switches are in the form of terminals interconnected by an electrically insulative switch paste material.

4. The improvement of claim 1 wherein said normally closed (N/C) switches are in the form of solid electrical conductive material.

5. The improvement of claim 1 wherein said printed circuit is a die-stamped metal circuit, said normally open (N/O) switches are in the form of an electrically insulative switch paste material and said normally closed (N/C) switches are in the form of solid electrically conductive material.

6. The improvement of claim 1 wherein said normally closed (N/C) switches serve as a portion of said printed circuit.

7. A multilamp photoflash array having a circuit board, a printed circuit having a plurality of circuit runs affixed to said circuit board, a plurality of flashlamps connected to said printed circuit, a normally open (N/O) switch adjacent each one of said flashlamps and having at least one of said switches overlaying a portion of said printed circuit and a plurality of normally closed (N/C) switches forming a portion of said circuit run with one of said normally closed (N/C) switches adjacent each one of said flashlamps and at least one of said normally closed (N/C) switches overlaying said normally open switch overlaying said portion of said printed circuit.

8. The multilamp photoflash array of claim 7 wherein said normally open (N/O) switches are formed of electrically insulative switch paste and said normally closed (N/C) switches are formed of a solid electrically conductive material.

9. The multilamp photoflash array of claim 7 wherein said normally closed (N/C) switches are formed of a solder material.

10. The multilamp photoflash array of claim 7 wherein said array includes first and second sectors each having a plurality of sequentially energizable flashlamps and a plurality of normally open (N/O) and normally closed (N/C) switches and first and second circuit connector means with said first and second circuit connector means formed to sequentially energize said flashlamps of said second and first sectors respectively and for energizing said flashlamps of said first and second sectors upon completion of energization of said flashlamps of said second and first sectors respectively.

11. A process for fabricating a multilamp photoflash array having a plurality of flashlamps, normally open (N/O) and normally closed (N/C) switches comprising the steps of:
affixing a printed circuit having a plurality of circuit runs to a circuit board;
depositing a normally open (N/O) switch adjacent each one of said flashlamps with at least one of said switches overlying a portion of one of said circuit runs of said printed cricuit; and
attaching a plurality of normally closed (N/C) switches to said printed circuit with said switches forming a portion of at least one of said circuit runs, forming a normally closed (N/C) switch adjacent each one of said flashlamps and overlaying a portion of said normally open (N/O) switch overlaying a portion of one of said circuit runs of said printed circuit.

12. The process of claim 11 wherein said deposited normally open (N/O) switches are in the form of a switch paste intermediate a pair of terminals of said printed circuit and said normally closed (N/C) switches are in the form of a solid conductor.

13. The process of claim 11 wherein said printed circuit is in the form of a die-stamped circuit, said normally open (N/O) switches are formed of a switch paste material and said normally closed (N/C) switches are in the form of a solid electrically conductive material.

14. The process of claim 11 wherein said printed circuit is in the form of an electrical conductor, said normally open (N/O) switches are in the form of an electrical insulator overlaying a portion of said printed circuit and said normally closed (N/C) switches are in the form of a solid electrical conductor forming a portion of said circuit runs and overlaying a portion of one of said normally open (N/O) switches overlaying said portion of said printed circuit.

15. The process of claim 11 wherein said printed circuit is die-stamped onto said circuit board, said normally open (N/O) switches are deposited in the form of a switch paste and said normally closed (N/C) switches are attached by soldering to said printed circuit.

16. The process of claim 11 wherein said array includes first and second sectors each having a plurality of flashlamps, normally open (N/O) and normally closed (N/C) switches with said normally closed (N/C) switches of each of said sectors formed of a continuous strip of solid electrical conductive material.

* * * * *